(12) United States Patent
Matsuzawa et al.

(10) Patent No.: US 7,057,302 B2
(45) Date of Patent: Jun. 6, 2006

(54) STATIC RANDOM ACCESS MEMORY

(75) Inventors: Kazuya Matsuzawa, Kanagawa (JP); Ken Uchida, Kanagawa (JP); Takahiro Nakauchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 10/909,399

(22) Filed: Aug. 3, 2004

(65) Prior Publication Data

US 2005/0062071 A1    Mar. 24, 2005

(30) Foreign Application Priority Data

Sep. 24, 2003  (JP)  ............................ P.2003-332107

(51) Int. Cl.
*H01L 27/11*  (2006.01)

(52) U.S. Cl. .................. 257/903; 257/216; 257/220; 257/222; 257/239; 257/E27.15; 257/E29.231

(58) Field of Classification Search ................ 257/216, 257/220, 222, 239, E27.15, E29.231
See application file for complete search history.

(56) References Cited

U.S. PATENT DOCUMENTS 5,223,725 A  *  6/1993  Miwada ...................... 257/239

FOREIGN PATENT DOCUMENTS

JP           3378512        12/2002

OTHER PUBLICATIONS

K. Matsuzawa et al., "Device Simulation and Measurement of Hybrid SBTT," *Simulation of Semiconductor Processes and Devices 2001—SISPAD 01*, Pub. by SpringerWien, NY, D. Tsoukalas et al., eds., pp. 380-383 (2001).

* cited by examiner

*Primary Examiner*—Mai-Huong Tran
(74) *Attorney, Agent, or Firm*—Finnegan, Henderson, Farabow, Garrett & Dunner, L.L.P.

(57) ABSTRACT

A static random access memory has first and second complementary field-effect transistors. The first complementary field-effect transistor includes a semiconductor substrate, a first field-effect transistor of electron conduction type which has a first drain region constituting a Schottky junction and a gate electrode, and a first field-effect transistor of positive hole conduction type which shares the first drain region and has a shared gate electrode. The second complementary field-effect transistor includes a second field-effect transistor of electron conduction type which has a second drain region and a gate electrode, a second field-effect transistor of positive hole conduction type which shares the second drain region and has a shared gate electrode. The gate electrode shared by the first and second complementary field-effect transistors is connected to the common drain region of the mutually opposing complementary field-effect transistors, and the static random access memory has superior resistance to software errors.

12 Claims, 5 Drawing Sheets

STATIC RANDOM ACCESS MEMORY

CROSS-REFERENCE TO RELATED APPLICATIONS

This application is based upon and claims the benefit of priority from the prior Japanese Patent Application No. 2003-332107, filed Sep. 24, 2003, the entire contents of which are incorporated herein by reference.

BACKGROUND OF THE INVENTION

1. Field of the Invention

The present invention relates to static random access memory (hereinafter called "SRAM") equipped with a complementary field-effect transistor.

2. Background Art

One of high-speed, power-thrifty semiconductor memory devices is SRAM formed from a complementary metal-oxide-semiconductor field-effect transistor (hereinafter abbreviated as CMOS). The CMOS has a field-effect transistor of electronic conduction type and a field-effect transistor of hole conduction type. Each memory cell of the SRAM has two CMOS devices, and a field-effect transistor constituting a transfer gate connected to the respective CMOS devices.

In such a field-effect transistor, when α rays or neutrons have cut across a depletion layer formed between a high-density impurity diffusion layer of a drain region and a substrate well, generated electrons or positive holes are collected into the drain region by means an electric field in the depletion layer and diffusion in the substrate. As a result, a logical state of the SRAM is inverted, thereby causing a software error.

Incidentally, there has already been put forth a proposal for realizing commonality between a conduction-type field-effect transistor and an electron-type field-effect transistor through use of a Schottky junction in order to miniaturize a CMOS (see JP2000-124329(Kokai)).

SUMMARY OF THE INVENTION

The conventional SRAM has a problem of frequent occurrence of a software error due to a rays or neutrons having entered the depletion layer within the substrate of the field-effect transistor.

An object of the present invention is to improve software error resistance of such an SRAM cell.

In order to solve the problem, a first aspect of the present invention provides a static random access memory which has a first complementary field-effect transistor, a first transfer gate, a second complementary field-effect transistor, and a second transfer gate. The first complementary field-effect transistor includes a first field-effect transistor of electron conduction type which has a first drain region constituting a Schottky junction with a semiconductor substrate and a gate electrode formed on the semiconductor substrate, and a first field-effect transistor of positive hole conduction type which shares the first drain region with the first field-effect transistor of electron conduction type and has a gate electrode which is shared by the first field-effect transistor of electron conduction type and provided on a semiconductor substrate. The first transfer gate is formed from a field-effect transistor which shares the first drain region with the first complementary field-effect transistor. The second complementary field-effect transistor includes a second field-effect transistor of electron conduction type which has a second drain region constituting a Schottky junction with the semiconductor substrate and a gate electrode formed on the semiconductor substrate, and a second field-effect transistor of positive hole conduction type which shares the second drain region with the second field-effect transistor of electron conduction type and has a gate electrode which is shared by the second field-effect transistor of electron conduction type and provided on the semiconductor substrate. The second transfer gate is formed from a field-effect transistor which shares the second drain region with the second complementary field-effect transistor. The common gate electrode of the first complementary field-effect transistor is connected to the second drain region, and a common gate electrode of the second complementary field-effect transistor is connected to the first drain region.

In order to solve the problem, a second aspect of the present invention provides a static random access memory which has a first complementary field-effect transistor, a first transfer gate, a second complementary field-effect transistor, and a second transfer gate. The first complementary field-effect transistor includes a first field-effect transistor of electron conduction type which has a first drain region constituting a Schottky junction with a semiconductor substrate and a gate electrode formed on the semiconductor substrate, a first field-effect transistor of positive hole conduction type which shares the first drain region with the first field-effect transistor of electron conduction type and has a gate electrode which is shared by the first field-effect transistor of electron conduction type, and a first interconnection which is formed in the first drain region by way of a dielectric layer and connects the gate electrode of the first field-effect transistor of electron conduction type to the gate electrode of the first field-effect transistor of positive hole conduction type. The first transfer gate is formed from a field-effect transistor which shares the first drain region with the first complementary field-effect transistor. The second complementary field-effect transistor includes a second field-effect transistor of electron conduction type which has a second drain region constituting a Schottky junction with the semiconductor substrate, and a gate electrode formed on the semiconductor substrate, a second field-effect transistor of positive hole conduction type which shares the second -drain region with the second field-effect transistor of electron conduction type and has a gate electrode which is shared by the second field-effect transistor of electron conduction type, and a second interconnection which is formed on the second drain region by way of a dielectric layer and connects the gate electrode of the second field-effect transistor of electron conduction type to the gate electrode of the second field-effect transistor of positive hole conduction type. The second transfer gate is formed from a field-effect transistor which shares the second drain region with the second complementary field-effect transistor. The common gate electrode of the first complementary field-effect transistor is connected to the second drain region, and a common gate electrode of the second complementary field-effect transistor is connected to the first drain region.

BRIEF DESCRIPTION OF THE DRAWINGS

The present invention may be more readily described with reference to the accompanying drawings.

DETAILED DESCRIPTION OF THE INVENTION

Figure 1:
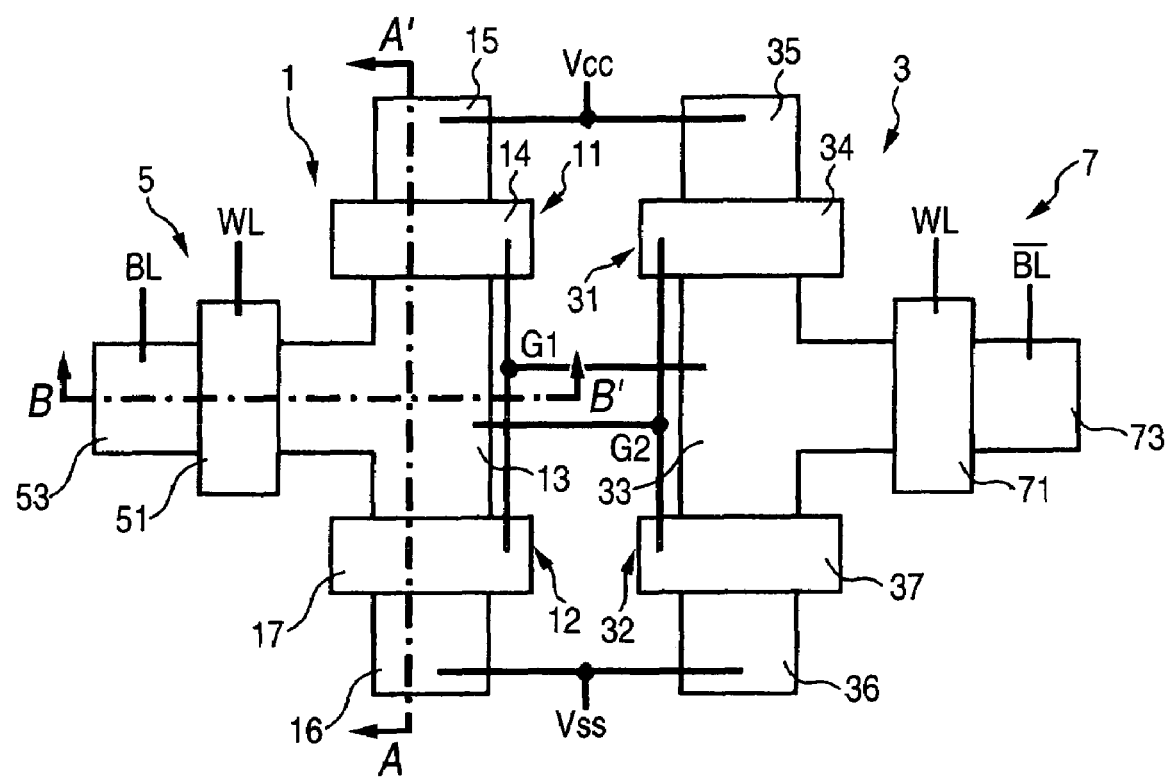
FIG. 1 is a plane layout view for describing an SRAM memory cell according to a first embodiment of the present invention (showing a part of connection relationship)

Respective embodiments of the present invention will be described hereinbelow by reference to the drawings. Constituent elements common to embodiments and examples are assigned the same reference numerals, and their repeated explanations are omitted. The drawings are schematic views for prompting the reader to comprehend descriptions of the invention. In some points, a device of the present invention differs from an actual device in terms of shape, dimension, and ratio. The shapes, dimensions, and ratios can be changed in design in consideration of the following descriptions and known techniques, as required.

FIRST EMBODIMENT

FIG. 1 shows a top view of an SRAM memory cell according to an embodiment of the present invention.

This SRAM memory cell has a first CMOS 1 and a second CMOS 3. The first CMOS 1 has a field-effect transistor 11 of positive hole conduction type and a field-effect transistor 12 of electron conduction type, which share a drain region 13. A gate electrode 14 of the field-effect transistor 11 of positive hole conduction type and a gate electrode 17 of the field-effect transistor 12 of electron conduction type are connected together (made common to the gate electrodes 14, 17) by means of an interconnection G1. Reference numeral 15 designates a source region of the field-effect transistor 11 of positive hole conduction type; and 16 designates a source region of the field-effect transistor 12 of electron conduction type.

The second CMOS 3 has a field-effect transistor 31 of positive conduction type and a field-effect transistor 32 of electron conduction type, which share a drain region 33. A first gate electrode 34 of the field-effect transistor 31 of positive hole conduction type and a gate electrode 37 of the field-effect transistor 32 of electron conduction type are connected together (made common to the transistors 31, 32) by means of an interconnection G2. Reference numeral 35 in FIG. 1 designates a source region of the field-effect transistor 31 of positive hole conduction type, and reference numeral 36 in FIG. 1 designates a source region of the field-effect transistor 32 of electron conduction type.

The source region 15 of the field-effect transistor 11 of positive hole conduction type of the first CMOS 1 and the source region 35 of the field-effect transistor 31 of positive hole conduction type of the second CMOS 3 are commonly connected together, and Vcc is supplied to the source regions 15, 35. The source regions 16, 36 of the field-effect transistors 12, 32 of electron conduction type are commonly connected together, and Vss is supplied to the source regions 16, 36. The common gate electrode G1 of the first CMOS 1 is connected to the shared drain region 33 of the second CMOS 3. The common gate electrode G2 of the second CMOS 3 is connected to the shared drain region 13 of the first CMOS 1. As a result, a pair of CMOS devices constitute a bi-stable flip-flop.

The SRAM memory cell further has two field-effect transistors 5, 7 of electron conduction type which constitute the transfer gate. The respective field-effect transistors of electron conduction type share the CMOS and the drain region. Specifically, the shared drain of the CMOS 1 constitutes the drain of the field-effect transistor 5 of electron conduction type, and the shared drain of the second CMOS 3 constitutes a drain of the field-effect transistor 7 of electron conduction type.

Here, the gate electrodes 51, 71 of the field-effect transistors 5, 7 are word lines WL and are connected to a word line control circuit. A source region 53 of the field-effect transistors 5, 7 is controlled by a bit line BL, and a source region 73 is controlled by the bit line BL.

Channels of the respective field-effect transistors are formed in positions of a semiconductor substrate (between the source region and the drain region) located below the respective gate electrodes, by means of control of the gate electrodes 14, 17, 34, 37, 51, and 71 and application of a drain voltage. The respective CMOS devices and the shared drain regions 13, 33 of the transfer gates can be formed from metal electrodes, e.g., $ErSi_2$.

Figure 2:
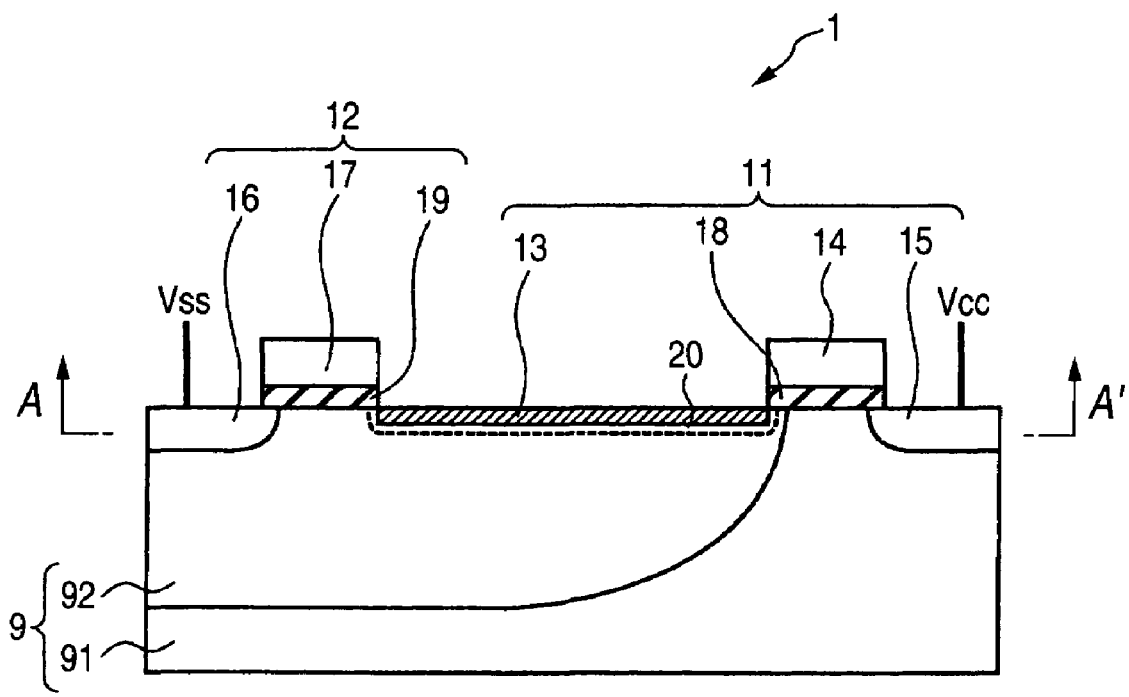
FIG. 2 is a cross-sectional diagrammatic view of the SRAM memory cell of the first embodiment taken along line A-A'.

FIG. 2 is a diagrammatic cross-sectional view of FIG. 1 taken along line A-A'.

The respective field-effect transistors of the present embodiment are fabricated on the surface of a substrate 9. A well region 91 doped with impurities is formed in a position of the substrate 9 located below the field-effect transistor 12 of electron conduction type. A well region 92 doped with p-type impurities is formed in a position of the substrate 9 located below the field-effect transistor 12 of electron conduction type. The respective transistors of the present embodiment are of insulated gate type, and the gate electrodes 14, 17 and the substrate 9 are insulated from each other by means of gate insulation films 18, 19.

As shown in FIG. 2, in the present embodiment, a metal layer connected to the semiconductor substrate 9 through a Schottky junction is used for the shared drain region 13. Hence, a depletion layer 20 surrounding the shared drain region 13 becomes considerably narrow. Accordingly, the number of electron-positive-hole pairs generated in the depletion layer by means of the α rays or the neutrons can be reduced as compared with the number of electron-positive-hole pairs generated in the drain region formed from a conventional impurity diffusion layer.

Figure 3:
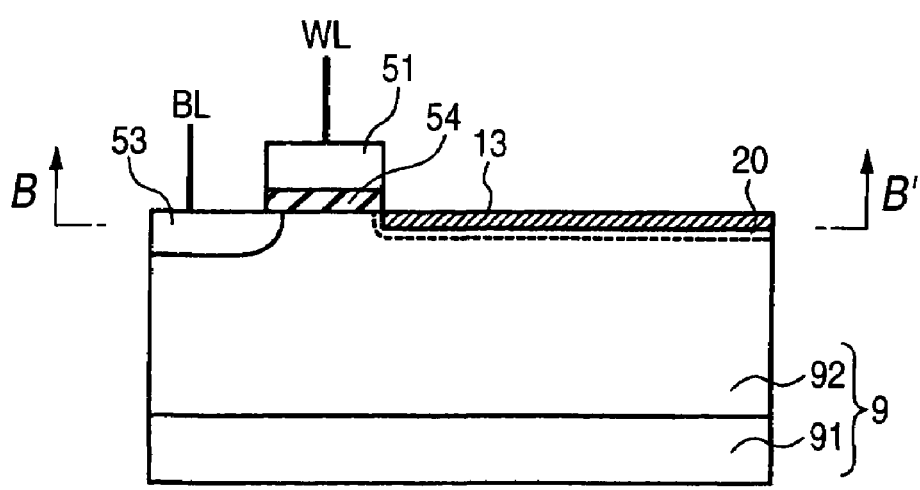
FIG. 3 is a cross-sectional diagrammatic view of the SRAM memory cell of the first embodiment taken along line B-B'.

FIG. 3 is a cross-sectional view taken along line B-B' of FIG. 1.

A shown in FIG. 3, a Schottky junction is formed between the shared drain region 13 and the semiconductor substrate 9, and hence the drain depletion layer 20 is narrow. The frequency of generation of the electron-positive-hole pairs can be reduced by means of the α rays or the neutrons. The interlayer insulation film to be formed on the semiconductor substrate 9 is omitted from FIGS. 2 and 3 and unillustrated.

In the metal drain region 13, the depletion layer around the metal drain region 13 is narrow. Hence, the SRAM memory cell also has a working effect of a short-channel effect being less likely to arise. When a heavily-doped impurity diffusion layer is used in the drain region, a wide depletion layer is formed between the drain region and the well region. As a result, controllability of the gate electrode is lost, which is in turn responsible for the short-channel effect. In order to suppress the short-channel effect, the gate electrode must be formed sufficiently long. However, the present embodiment obviates such a necessity, thereby enabling miniaturization of the semiconductor integrated circuit.

Metal silicide, such as $ErSi_2$, can be used as metal to be used for the shared drains 13, 33. Particularly, $ErSi_2$ has high barriers against the positive holes, thereby preventing leakage of a positive-hole current, which would otherwise arise between the $ErSi_2$ and the p-type well. Further, since the $ErSi_2$ is covered with the p-type well, the SRAM cell has any effect of suppressing leakage of an electron current between the $ErSi_2$ and the n-type well. These working effects are yielded as a result of a work function of metallic material used for forming a Schottky junction being higher than the center of the energy band gap of an intrinsic semiconductor and the Schottky junction being covered with a semiconductor region of positive hole conduction type formed in the semiconductor substrate. In addition to including $ErSi_2$ or the like, materials of such metal drains include $YSi_2$, $GdSi_2$, $DySi_2$, $HoSi_2$, and the like.

As mentioned previously, since the drain regions of all the field-effect transistors are formed from a covalent metal layer, the depletion layer formed from the Schottky barrier is much narrower than the p-n junction, thereby preventing occurrence of the short-channel effect and a software error, which would otherwise arise in the static random access memory. All the drain regions are shared, and an element isolation region, such as an STI (Shallow Trench Isolation), which has conventionally been required, is not required in the drain regions. This structure is suitable for miniaturizing the SRAM cell, and a layout for defining an element isolation is subjected to few restrictions.

Figure 4:
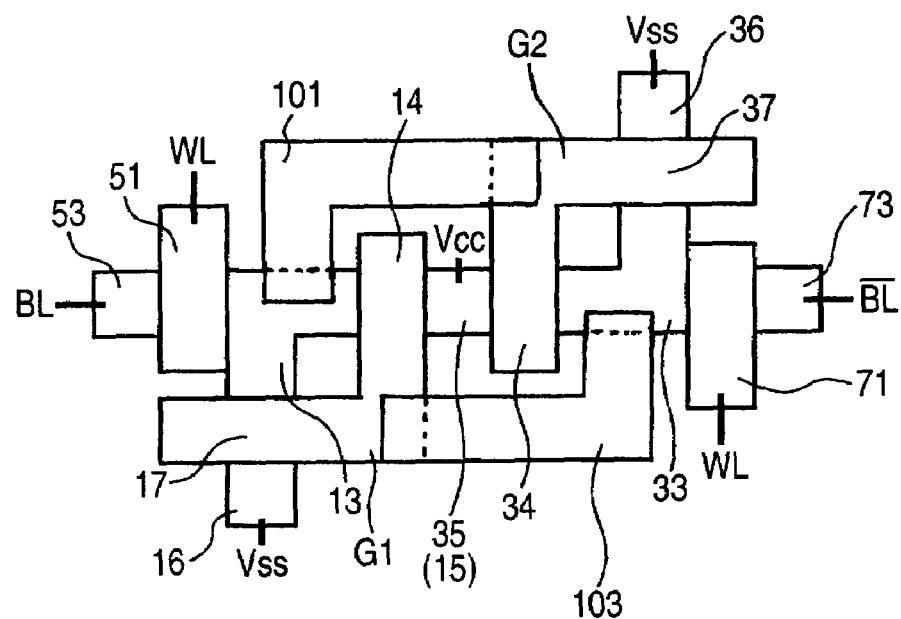
FIG. 4 is a plane layout view for describing the SRAM memory cell according to the first embodiment of the present invention (showing a part of connection relationship)

FIG. 4 shows a second plan view of the SRAM cell of the present embodiment. The second plan view differs from the first plan view in terms of a plane arrangement of the gate electrodes and the source/drain regions, without modifications on the structure of the respective transistors and the connections. In this embodiment, the common gates G1, G2 of the two CMOS devices are formed from L-shaped patterns. The L-shaped gates G1, G2 are arranged in combination with the common drains 13, 33, each being made of an L-shaped pattern, thereby constituting a rectangular pattern. With such a configuration, the common gate electrodes G1, G2 are arranged densely, thereby increasing integrity. Further, this configuration is suitable for use in a planarizing process, such as CMP (Chemical-Mechanical Polishing), immediately subsequent to formation of the gate electrode or a wiring process in a much later step.

In FIG. 4, one of the common gates of the CMOS; that is, the gate G1 (or G2), is connected to the drain region 33 (13) of the other CMOS by means of interconnections 101, 103. The interconnection 101 is connected to the drain region 13 and the gate G2 in respective overlapping regions. The interconnection 103 is connected to the gate G1 and the drain region 33 in respective overlapping regions.

The field-effect transistor to act as the transfer gate of the embodiment may be changed to a positive hole conduction type. In a case where the transfer gate is changed to a field-effect transistor of positive hole conduction type, the source regions 53, 73 of the transistor are taken as diffusion regions of p-type impurity. PtSi is used for, e.g., the common drains 13, 33, which are common drains of the CMOS.

Figure 5:
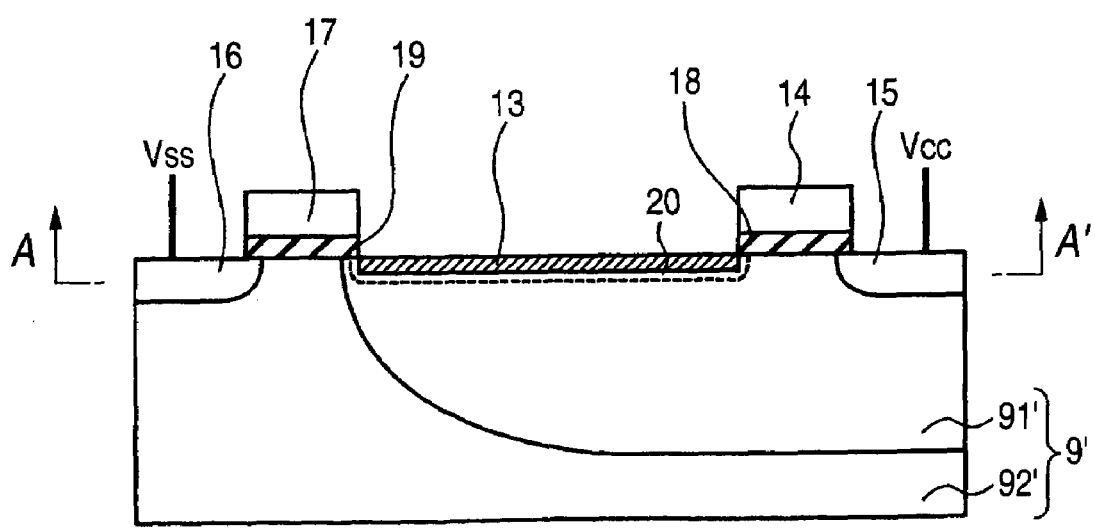
FIG. 5 is a diagrammatic cross-sectional view taken along line A-A' in the plane layout view shown in FIG. 1.
Figure 6:
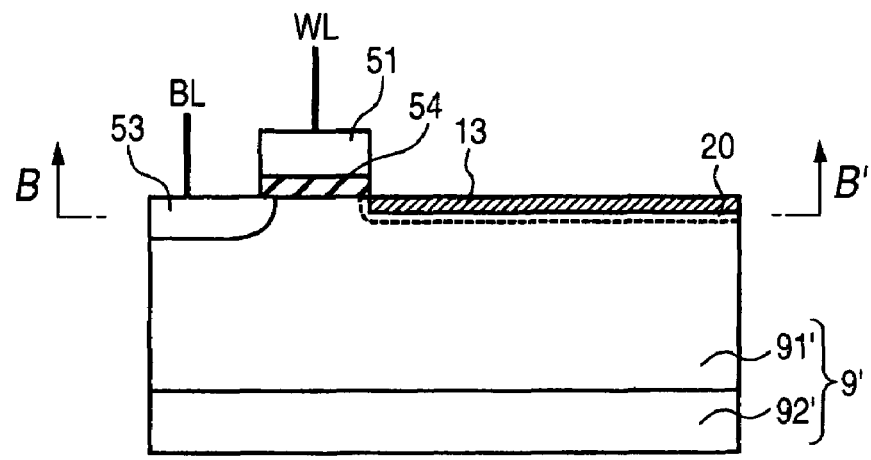
FIG. 6 is a diagrammatic cross-sectional view taken along line B-B' in the plane layout view shown in FIG. 1.

As can be seen from a modification of the cross-sectional view which is shown in FIG. 5 and taken along line A-A' shown in FIG. 1 and from a modification of the cross-sectional view which is shown in FIG. 6 and taken across line B-B' shown in FIG. 1, a channel region (i.e., a region between the source region and the drain region) located below the gate electrode 14 of the field-effect transistor of positive hole conduction type, the p-type source region 15, and an n-type well 91' enclosing the common drain region 13 are formed in a semiconductor substrate 9'. A p-type well 92' is formed so as to enclose the channel region, and the source region of the field-effect transistor of electron conduction type is formed adjacent to the n-type well in the semiconductor substrate 9'.

PtSi has a high barrier against electrons, and hence the PtSi drain region 13 prevents leakage of an electron current, which would otherwise arise between the n-type well and the PtSi. Further, PtSi is covered with the n-type well, and hence there can be prevented leakage of a positive hole current, which would otherwise arise between PtSi and the p-type well. These working effects involve a necessity for a work function of metallic material used for forming a Schottky junction being lower than the center of the energy band gap of an intrinsic semiconductor and the Schottky junction being covered with a semiconductor region of electron conduction type formed in the semiconductor substrate. In addition to including PtSi or the like, materials of such metal drains include $Pt_2Si$, IrSi, $IrSi_2$, and the like.

SECOND EMBODIMENT

A Schottky drain SRAM according to a second embodiment of the present invention will be described by reference to a top view shown in FIG. 7.

In this embodiment, the gate electrode 14 of the field-effect transistor of positive hole conduction type and the gate electrode 17 of field-effect transistor of electron conduction type, both belonging to the first CMOS 1, are connected together by means of an upper conductor layer M0, thereby forming a common gate of the first CMOS 1. This upper conductor layer M0 is connected to the drain region 33 of the second CMOS 3 by means of an upper conductor M1'.

The gate electrode 34 of positive hole conduction type of the second CMOS 3 is connected to the gate electrode 37 of electron conduction type by means of the upper conduction layer M0' and further to the drain region 13 of the first CMOS 1 by means of an upper conductor M1.

When the drain region of the CMOS and the drain region pertaining to the field-effect transistor of the transfer gate are made common in the manner mentioned above, a layout which is more minute than the conventional layout can be realized by utilization of a multilayer interconnection. Further, the present embodiment does not necessarily make the drain regions of the three field-effect transistors common.

Figure 7:
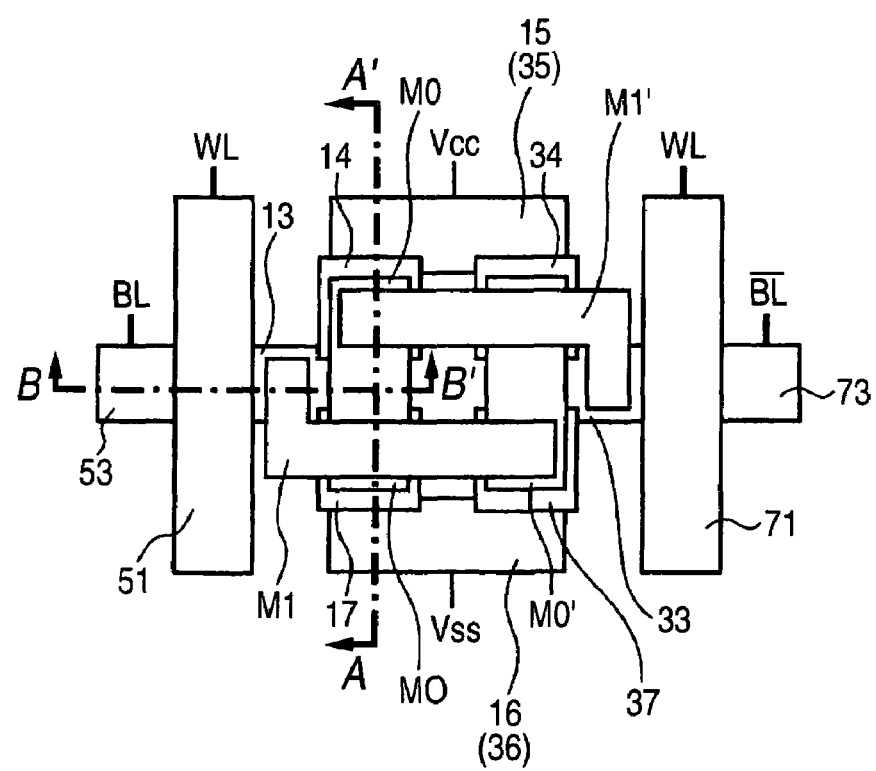
FIG. 7 is a plane layout view for describing an SRAM memory cell according to the second embodiment of the present invention (showing a part of connection relationship)
Figure 8:
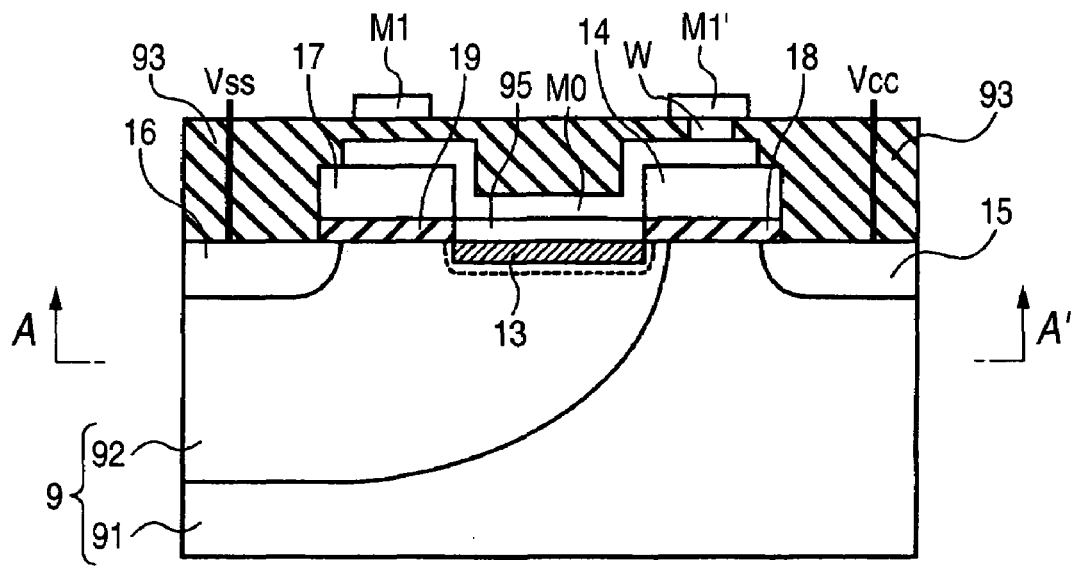
FIG. 8 is a diagrammatic cross-sectional view taken along line A-A' in the plane layout view shown in FIG. 7.
Figure 9:
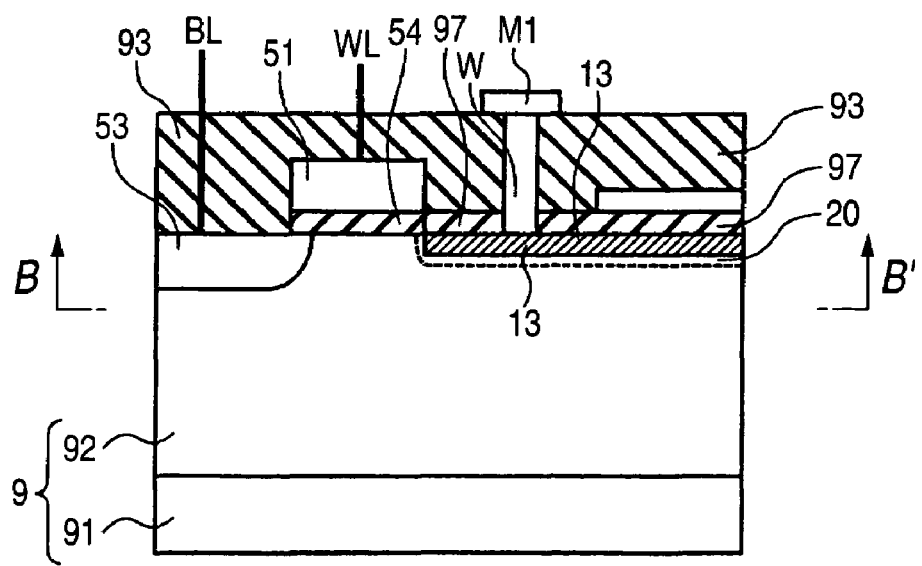
FIG. 9 is a diagrammatic cross-sectional view taken along line B-B' in the plane layout view shown in FIG. 7.

FIG. 8 is a diagrammatic cross-sectional view taken along line A-A' in the plane layout view shown in FIG. 7, and FIG. 9 is a diagrammatic cross-sectional view taken along line B-B' in the plane layout view shown in FIG. 7.

In the present embodiment, parasitic capacitance derived from the insulation layers 95, 97 formed between the M0 and the common drain region 13 forms a new capacitance component of the first COMS 1. Hence, there can be effectively prevented occurrence of logical inversion, which would otherwise be caused by errors in software, without consumption of a chip area. Although not shown in the cross-sectional view of the second CMOS 3, the second CMOS 3 and the first CMOS 1 are in a symmetrical relationship, and an advantageous effect identical with that yielded by the first CMOS 1 is yielded through use of the configuration identical with that of the first CMOS 1.

In the respective cross-sectional views, a so-called sidewall insulation film can also be provided on sidewalls of the gate electrodes 14, 17, and 51. In the gate electrodes 14, 17 shown in FIGS. 8 and 9, a side surface is in contact with the conductor M0, and hence contact resistance can be reduced. In contrast, when the sidewall insulation film is provided, a contact area is limited to the upper surfaces of the gate electrodes 14, 17. Hence, there arises a problem of an increase in contact resistance.

Insulation materials, such as silicon oxide or silicon nitride, can be used for the insulation layers 95, 97. Reference numeral 93 shown in FIGS. 8 and 9 denotes an interlayer insulation film made of, e.g., silicon oxide, and W denotes a contact used for connecting the conductor M0 to a conductor M1' and for connecting the common drain 13 to the conductor M1. The insulation layers 95, 97 are provided, thereby intentionally increasing parasitic capacitance without enlarging the chip area, and enhancing resistance to software errors.

As has been described, according to the present embodiment, a common drain region is used for the three field-effect transistors, thereby enhancing resistance to software errors, and increasing the degree of freedom of the layout and miniaturization of a cell.

In contrast, in the conventional CMOS using an impurity spread layer for the drain region, the drain region of the field-effect transistor of positive hole conduction type and the drain region of the field-effect transistor of electron conduction type are different from and independent of each other. In order to make the drain regions common, a contact must be formed, which makes reducing parasitic capacitance impossible. In the conventional CMOS, the chip area is increased in order to add a capacitance for preventing a software error.

In the previously-described first embodiment, no element isolation region is used. However, element isolation can be formed between the drain regions of the respective transistors. In such a case, the shared drain regions are separated from each other, and an interconnection must be made for connecting the thus-separated drain regions.

The embodiments of the present invention have been described thus far. However, the present invention is not limited to these embodiments and is susceptible to various alterations within the scope of gist of the present invention defined in the appended claims.

The present invention is subjected to various modifications within the scope of gist of the invention, in a stage for carrying out the invention.

Various inventions can be formed by appropriate combinations of a plurality of the constituent elements described in the embodiments. For instance, several constituent elements may be deleted from the overall constituent elements described in the embodiments. Moreover, the constituent elements employed in different embodiments may be combined together, as required.

According to the present invention, a common drain region is provided between a complementary field-effect transistor and a transfer gate, thereby forming a Schottky junction between the common drain region and the semiconductor substrate. Hence, the drain depletion layer can be made narrow, thereby diminishing the frequency of generation of electron-positive-hole pairs in the depletion layer, which would be caused by α rays or neutrons. Moreover, provision of the shared drain region enables an increase in the degree of freedom of layout of respective static random access memory devices and miniaturization of memory cells.

What is claimed is:

1. Static random access memory having a first complementary field-effect transistor, a first transfer gate, a second complementary field-effect transistor, and a second transfer gate, wherein the first complementary field-effect transistor has a first field-effect transistor of electron conduction type and a first field-effect transistor of positive hole conduction type;

the second complementary field-effect transistor has a second field-effect transistor of electron conduction type and a second field-effect transistor of positive hole conduction type;

the first field-effect transistor of electron conduction type has a first drain region constituting a Schottky junction with a semiconductor substrate and a gate electrode formed on the semiconductor substrate;

the first field-effect transistor of positive hole conduction type shares the first drain region in conjunction with the first field-effect transistor of electron conduction type and has a gate electrode which is shared by the first field-effect transistor of electron conduction type and provided on the semiconductor substrate;

the first transfer gate is formed from a field-effect transistor which shares the first drain region with the first complementary field-effect transistor;

the second field-effect transistor of electron conduction type has a second drain region constituting a Schottky junction with the semiconductor substrate and a gate electrode formed on the semiconductor substrate;

the second field-effect transistor of positive hole conduction type shares the second drain region in conjunction with the second field-effect transistor of electron conduction type and has a gate electrode which is shared by the second field-effect transistor of electron conduction type and provided on the semiconductor substrate;

the second transfer gate is formed from a field-effect transistor which shares the second drain region with the second complementary field-effect transistor;

the common gate electrode of the first complementary field-effect transistor is connected to the second drain region; and the common gate electrode of the second complementary field-effect transistor is connected to the first drain region.

2. Static random access memory having a first complementary field-effect transistor, a first transfer gate, a second complementary field-effect transistor, and a second transfer gate, wherein the first complementary field-effect transistor has a first field-effect transistor of electron conduction type, a first field-effect transistor of positive hole conduction type, and a first interconnection;

the second complementary field-effect transistor has a second field-effect transistor of electron conduction type, a second field-effect transistor of positive hole conduction type, and a second interconnection;

the first field-effect transistor of electron conduction type has a first drain region constituting a Schottky junction with a semiconductor substrate and a gate electrode formed on the semiconductor substrate;

the first field-effect transistor of positive hole conduction type shares the first drain region in conjunction with the first field-effect transistor of electron conduction type and has a gate electrode which is shared by the first field-effect transistor of electron conduction type;

the first transfer gate is formed from a field-effect transistor which shares the first drain region with the first complementary field-effect transistor;

the first interconnection is formed in the first drain region by way of a dielectric layer and connects the gate electrode of the first field-effect transistor of electron conduction type to the gate electrode of the first field-effect transistor of positive hole conduction type;

the second field-effect transistor of electron conduction type has a second drain region constituting a Schottky junction with the semiconductor substrate and a gate electrode formed on the semiconductor substrate;

the second field-effect transistor of positive hole conduction type shares the second drain region in conjunction with the second field-effect transistor of electron conduction type and has a gate electrode which is shared by the second field-effect transistor of electron conduction type;

the second transfer gate is formed from a field-effect transistor which shares the second drain region with the second complementary field-effect transistor;

the second interconnection is formed in the second drain region by way of a dielectric layer and connects the gate electrode of the second field-effect transistor of electron conduction type to the gate electrode of the second field-effect transistor of positive hole conduction type;

a common gate electrode of the first complementary field-effect transistor is connected to the second drain region; and a common gate electrode of the second complementary field-effect transistor is connected to the first drain region.

3. The static random access memory according to claim 1, wherein the first and second drain regions are formed from an integral metallic material film.

4. The static random access memory according to claim 2, wherein the first and second drain regions are formed from an integral metallic material film.

5. The static random access memory according to claim 1, wherein a work function of a metallic material of the first and second drain regions is higher than an energy value at the center of an energy band gap of an intrinsic semiconductor, and the first and second drain regions are covered with a semiconductor region of positive hole conduction type formed in the semiconductor substrate.

6. The static random access memory according to claim 2, wherein a work function of a metallic material of the first and second drain regions is higher than an energy value at the center of an energy band gap of an intrinsic semiconductor, and the first and second drain regions are covered with a semiconductor region of positive hole conduction type formed in the semiconductor substrate.

7. The static random access memory according to claim 3, wherein a work function of a metallic material of the first and second drain regions is higher than an energy value at the center of an energy band gap of an intrinsic semiconductor, and the first and second drain regions are covered with a semiconductor region of positive hole conduction type formed in the semiconductor substrate.

8. The static random access memory according to claim 4, wherein a work function of a metallic material of the first and second drain regions is higher than an energy value at the center of an energy band gap of an intrinsic semiconductor, and the first and second drain regions are covered with a semiconductor region of positive hole conduction type formed in the semiconductor substrate.

9. The static random access memory according to claim 1, wherein a work function of a metallic material of the first and second drain regions is lower than an energy value at the center of an energy band gap of an intrinsic semiconductor, and the first and second drain regions are covered with a semiconductor region of electron conduction type formed in the semiconductor substrate.

10. The static random access memory according to claim 2, wherein a work function of a metallic material of the first and second drain regions is lower than an energy value at the center of an energy band gap of an intrinsic semiconductor, and the first and second drain regions are covered with a semiconductor region of electron conduction type formed in the semiconductor substrate.

11. The static random access memory according to claim 3, wherein a work function of a metallic material of the first and second drain regions is lower than an energy value at the center of an energy band gap of an intrinsic semiconductor, and the first and second drain regions are covered with a semiconductor region of electron conduction type formed in the semiconductor substrate.

12. The static random access memory according to claim 4, wherein a work function of a metallic material of the first and second drain regions is lower than an energy value at the center of an energy band gap of an intrinsic semiconductor, and the first and second drain regions are covered with a semiconductor region of electron conduction type formed in the semiconductor substrate.

* * * * *